United States Patent
Kennedy et al.

(10) Patent No.: US 7,827,657 B2
(45) Date of Patent: Nov. 9, 2010

(54) METHOD OF MAKING AN ELECTRODE ASSEMBLY FOR PLASMA PROCESSING APPARATUS

(75) Inventors: William S. Kennedy, Fremont, CA (US); David E. Jacob, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 12/436,924

(22) Filed: May 7, 2009

(65) Prior Publication Data

US 2009/0211085 A1  Aug. 27, 2009

Related U.S. Application Data

(62) Division of application No. 10/623,540, filed on Jul. 22, 2003, now Pat. No. 7,543,547.

(60) Provisional application No. 60/400,451, filed on Jul. 31, 2002.

(51) Int. Cl.
  *B21D 33/00* (2006.01)
(52) U.S. Cl. .............. 29/20; 29/874; 29/876; 29/877; 156/345.33; 156/345.47
(58) Field of Classification Search .......... 29/20, 29/825, 846, 874, 876, 877; 118/715, 723 R, 118/723 E, 724, 725; 156/345.33, 345.34, 156/345.43, 345.47
See application file for complete search history.

(56) References Cited

U.S. PATENT DOCUMENTS

| 4,270,999 | A | 6/1981 | Hassan et al. |
|---|---|---|---|
| 4,585,920 | A | 4/1986 | Hoog et al. |
| 4,612,077 | A | 9/1986 | Tracy et al. |
| 5,423,936 | A | 6/1995 | Tomita et al. |
| 5,449,410 | A | 9/1995 | Chang et al. |
| 5,534,751 | A | 7/1996 | Lenz et al. |
| 5,567,243 | A | 10/1996 | Foster et al. |
| 5,569,356 | A | 10/1996 | Lenz et al. |
| 5,628,829 | A | 5/1997 | Foster et al. |
| 5,641,389 | A | 6/1997 | Strauss et al. |
| 5,647,911 | A | 7/1997 | Vanell et al. |
| 5,681,135 | A | 10/1997 | Simonson |
| 5,766,364 | A | 6/1998 | Ishida et al. |
| 5,906,683 | A | 5/1999 | Chen et al. |
| 6,073,577 | A | 6/2000 | Lilleland et al. |
| 6,123,775 | A | 9/2000 | Hao et al. |
| 6,187,152 | B1 | 2/2001 | Ting et al. |

(Continued)

FOREIGN PATENT DOCUMENTS

JP  4316709 A  11/1992

OTHER PUBLICATIONS

U.S. Appl. No. 10/623,540, filed Jul. 11, 2003.

*Primary Examiner*—Thiem Phan
(74) *Attorney, Agent, or Firm*—Buchanan Ingersoll & Rooney PC

(57) ABSTRACT

A method of making an electrode assembly for a plasma processing apparatus includes securing a backing member to an electrode wherein first fastener members mounted in apertures in the backing member cooperate with second fastener members to hold the electrode assembly to a support member, such as a temperature-controlled top plate in a plasma processing chamber.

8 Claims, 8 Drawing Sheets

U.S. PATENT DOCUMENTS

| | | |
|---|---|---|
| 6,192,827 B1 | 2/2001 | Welch et al. |
| 6,194,322 B1 | 2/2001 | Lilleland et al. |
| 6,207,006 B1 | 3/2001 | Katoh |
| 6,302,964 B1 | 10/2001 | Umotoy et al. |
| 6,409,897 B1 | 6/2002 | Wingo |
| 6,461,435 B1 | 10/2002 | Littau et al. |
| 6,468,925 B2 | 10/2002 | Campbell et al. |
| 6,818,096 B2 | 11/2004 | Barnes et al. |
| 6,827,815 B2 | 12/2004 | Hytros et al. |
| 2002/0108711 A1 | 8/2002 | Kim |
| 2004/0074609 A1 | 4/2004 | Fischer et al. |

METHOD OF MAKING AN ELECTRODE ASSEMBLY FOR PLASMA PROCESSING APPARATUS

CROSS-REFERENCE TO RELATED APPLICATIONS

This application is a divisional application of U.S. application Ser. No. 10/623,540 entitled ELECTRODE ASSEMBLY FOR PLASMA PROCESSING APPARATUS, filed on Jul. 22, 2003 now U.S. Pat. No. 7,543,547, which claims the benefit of U.S. Provisional Application No. 60/400,451, filed Jul. 31, 2002, the entire contents of each is hereby incorporated by reference.

BACKGROUND

Plasma processing apparatuses are used to process substrates by techniques including etching, physical vapor deposition (PVD), chemical vapor deposition (CVD), ion implantation, and resist removal. One type of plasma processing apparatus used in plasma processing includes a reaction chamber containing upper and lower electrodes. An electric field is established between the electrodes to excite a process gas into the plasma state to process substrates in the reaction chamber.

SUMMARY

A component for a plasma processing apparatus is provided. In a preferred embodiment, the component includes a first member bonded to a second member. The first member includes a plurality of through apertures, each having a first portion, and a wider second portion. The component also includes a plurality of first fastener members adapted to be mounted in the apertures. The first fastener members preferably include a bearing surface facing a surface at least partially defining the second portion of the aperture.

In a preferred embodiment, the component is an electrode assembly.

In another embodiment, the electrode assembly is attached to a top plate. The top plate is mounted, or adapted to be mounted, inside a reaction chamber of a plasma processing apparatus. The top plate includes through openings aligned with the apertures in the backing member. Second fastener members can each be received in an opening of the top plate and an aligned aperture of the backing member, and attached to a first fastener member to attach the backing member to the top plate.

In a preferred embodiment, the electrode assembly is a showerhead electrode assembly.

A preferred embodiment of a method of making a component for a plasma processing apparatus comprises securing a first part, such as a backing member to a second part, such as an electrode. The first part includes a plurality of apertures including a first portion and a wider second portion. A first fastener member is mounted in each aperture. The first fastener members preferably include a head in the second portion of the aperture. The head is preferably configured to prevent the first fastener member from being pulled out of the aperture, or from rotating.

DETAILED DESCRIPTION

Components for plasma processing apparatuses are provided. In a preferred embodiment, the component is an electrode assembly for a plasma processing apparatus. The electrode assembly can include a backing member secured to an electrode.

The electrode can be secured to the backing member by a bonding technique. The bonding material can be a thermally and electrically conductive bonding material, such as an elastomer that provides thermal and electrical attachment of the electrode material to the backing member. The use of elastomers for bonding surfaces together is described, for example, in commonly-owned U.S. Pat. No. 6,073,577, which is incorporated herein by reference in its entirety.

The electrode preferably is a solid or a perforated plate of single crystal silicon. The electrode can optionally have through gas passages when used as a showerhead electrode. The backing member is preferably a plate of a material that is chemically compatible with process gases used in the plasma processing chamber, has a coefficient of thermal expansion closely matching that of the electrode material, and is electrically and thermally conductive. Suitable materials for making the backing member include graphite and SiC, for example.

In another preferred embodiment of the electrode assembly, the backing member is attached to a top plate.

Figure 1:
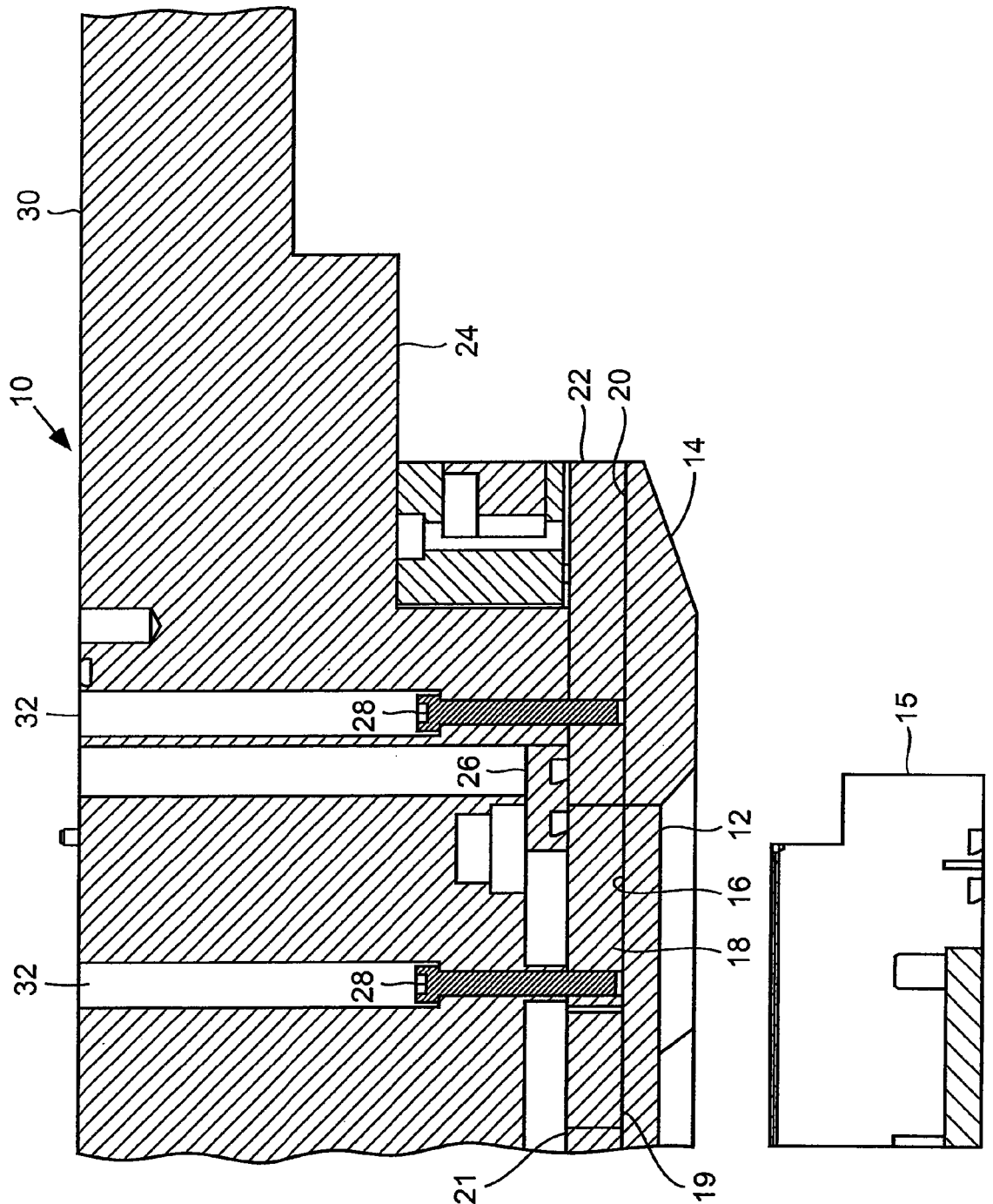
FIG. 1 depicts an upper electrode assembly and a lower electrode for a plasma reaction chamber.

FIG. 1 depicts a preferred embodiment of an upper electrode assembly 10, which comprises an upper electrode preferably including an inner electrode member 12, and an outer electrode member 14. A lower electrode 15 is shown positioned below the upper electrode. In an embodiment, the inner electrode member 12 is preferably a cylindrical plate. The outer electrode member 14 can be continuous member (e.g., a poly-silicon member, such as a ring), or can alternatively include multiple segments (e.g., 2-6 segments). In embodiments including a multiple-segment outer electrode member 14, contiguous segments preferably overlap each other to protect the underlying joint, such as an elastomeric joint, from exposure to plasma.

The upper electrode can be electrically grounded, or it can be powered with radio-frequency (RF) current. The upper electrode can be a showerhead electrode with multiple gas passages for injecting a process gas into a plasma reaction chamber containing the upper electrode and lower electrode 15. The upper electrode assembly 10 and the lower electrode 15 can be used in various plasma processing operations, such as dry etching, chemical vapor deposition, ion implantation, and resist stripping, in the reaction chamber.

Single crystal silicon is a preferred material for plasma exposed surfaces of the inner electrode member 12 and of the outer electrode member 14. High-purity, single crystal silicon minimizes contamination of semiconductor substrates during plasma processing because it introduces a minimal amount of undesirable elements into the reaction chamber, and also wears smoothly during plasma processing, thereby creating very few particles. Other materials that can be used for plasma-exposed surfaces of the upper electrode include SiC, SiN, AlN, and $Al_2O_3$, for example.

The backing member preferably includes a backing plate 18, which is co-extensive with the inner electrode member 12, and an outer backing ring 22. The backing member is preferably made of graphite. The top surface 16 of the inner electrode member 12 is preferably bonded to the backing plate 18, and the top surface 20 of the outer electrode member 14 is preferably bonded to a continuous backing ring 22.

The backing plate 18 and backing ring 22 are attached to a top plate 24. The top plate 24 is preferably temperature controlled by flowing a heat transfer fluid (liquid or gas) through it. The top plate 24 is preferably made of a metal having suitable thermal conductivity, such as aluminum, or an aluminum alloy. The top plate 24 preferably provides an electrical ground and a heat sink for the electrode. Preferably, a vacuum seal is provided between the top plate 24 and the backing plate 18 and/or backing ring 22. For example, a sealing member, such as a sealing ring 26, can be located between the backing plate 18 and the top plate 24 to minimize gas leakage through an interface between the inner electrode member 12 and the outer electrode member 14.

Figure 2:
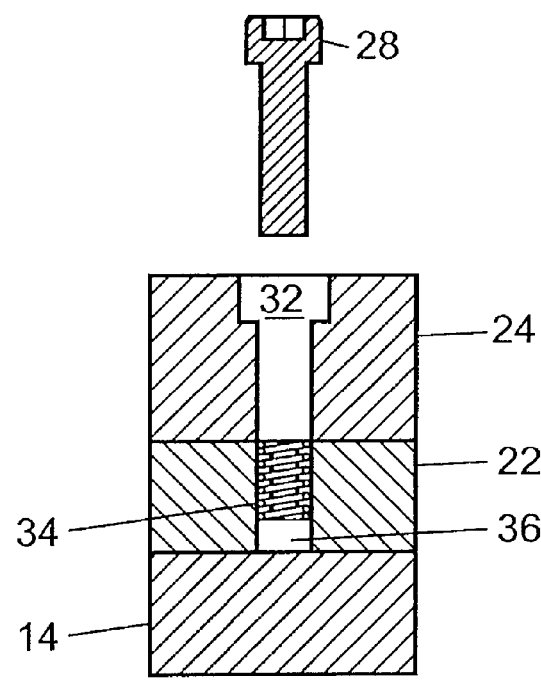
FIG. 2 depicts a fastener including a helicoil used in an upper electrode assembly.

In the embodiment shown in FIG. 1, the backing plate 18 and backing ring 22 are attached to the top plate 24 by fastener members 28. The fastener members 28 can be threaded screws, bolts, or the like. The fastener members 28 are inserted from the top surface 30 of the top plate 24 into openings 32 and aligned apertures in the backing plate 18 and backing ring 22. FIG. 2 shows an embodiment in which the top plate 24 is attached to the backing ring 22 by helicoils 34 inserted in apertures 36 in the backing ring 22 (the backing plate 18, inner electrode member 12, and overlying portion of the top plate 24 are not shown for simplicity). The helicoils 34 increase the strength of the threaded connection with the fastener members 28, as graphite is brittle and has low shear strength. Gas leakage at the apertures 36 can be minimized by a cover plate (not shown) covering the openings 32. The top plate 24 is shown attached to the backing ring 22 in FIG. 2; however, the same mounting arrangement can be used to attach the backing plate 18 to the top plate 24.

It has been determined that the helicoils 34 are prone to pull out of the backing plate 18 and backing ring 22 at low bolt torque during assembly. Also, the helicoils 34 can back out of the apertures 36 when the fastener members 28 are removed.

Figure 3:
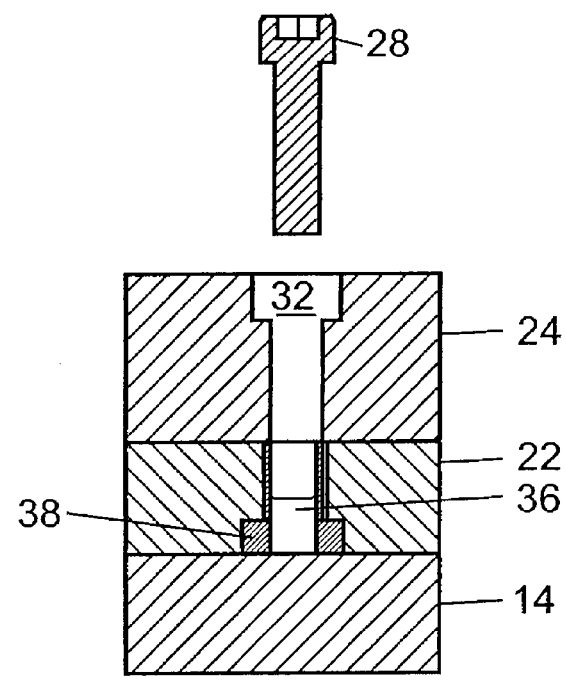
FIG. 3 depicts a preferred embodiment of an upper electrode assembly including a fastener member with a T-nut.
Figure 4:
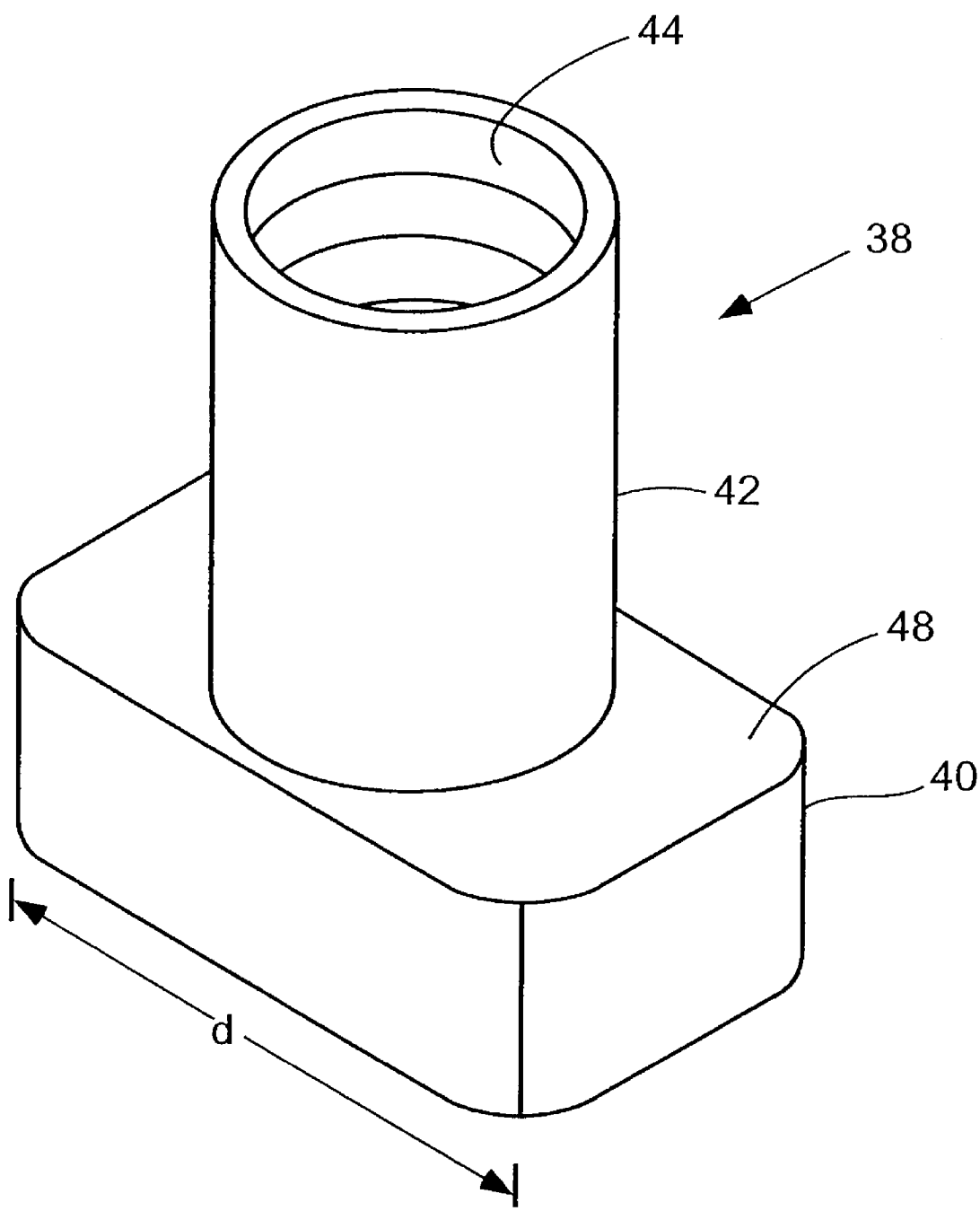
FIG. 4 is a perspective view of a T-nut.
Figure 5:
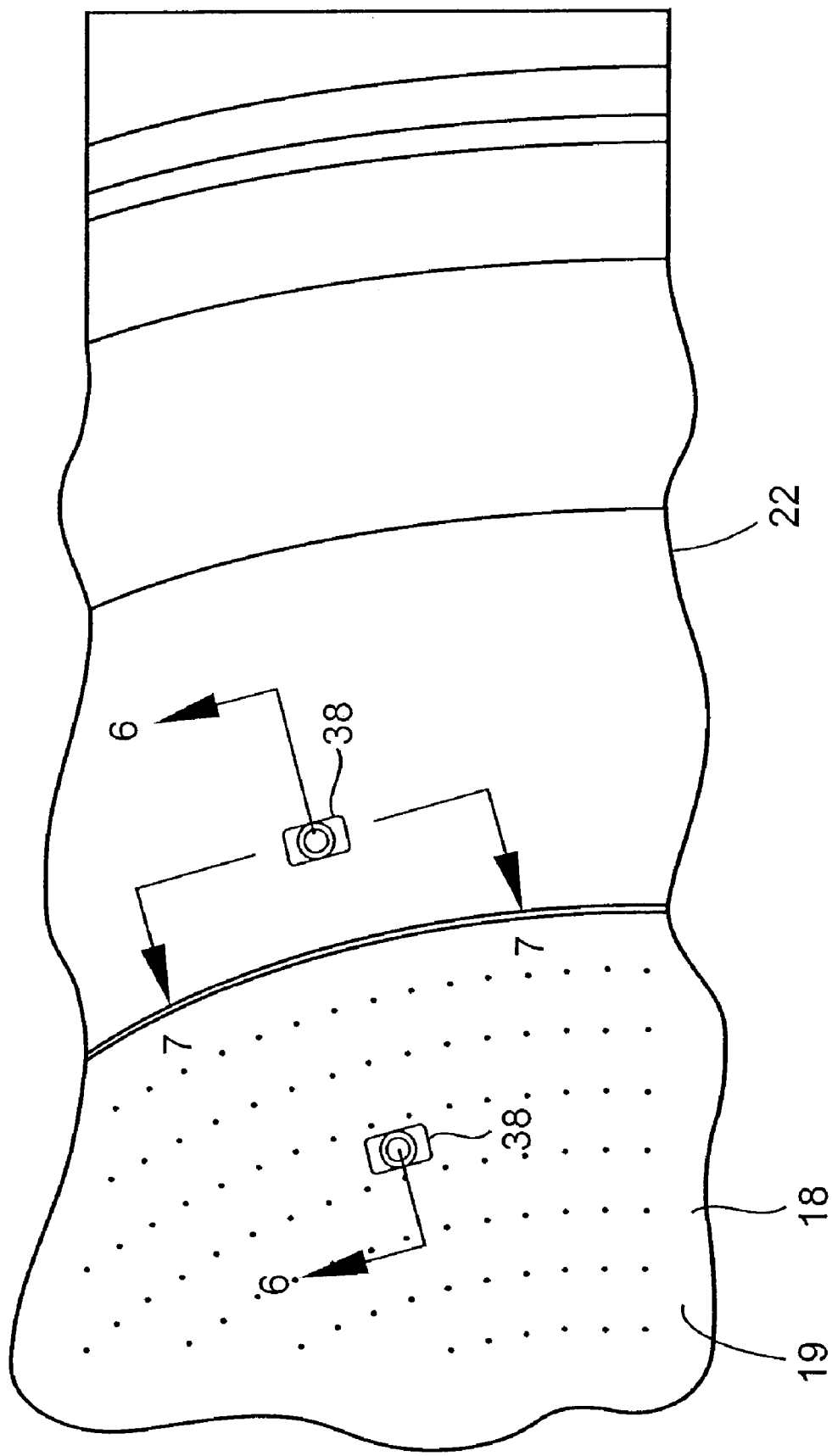
FIG. 5 is a bottom plan view of a preferred embodiment of an upper electrode assembly with the electrode removed to show the backing member.
Figure 6:
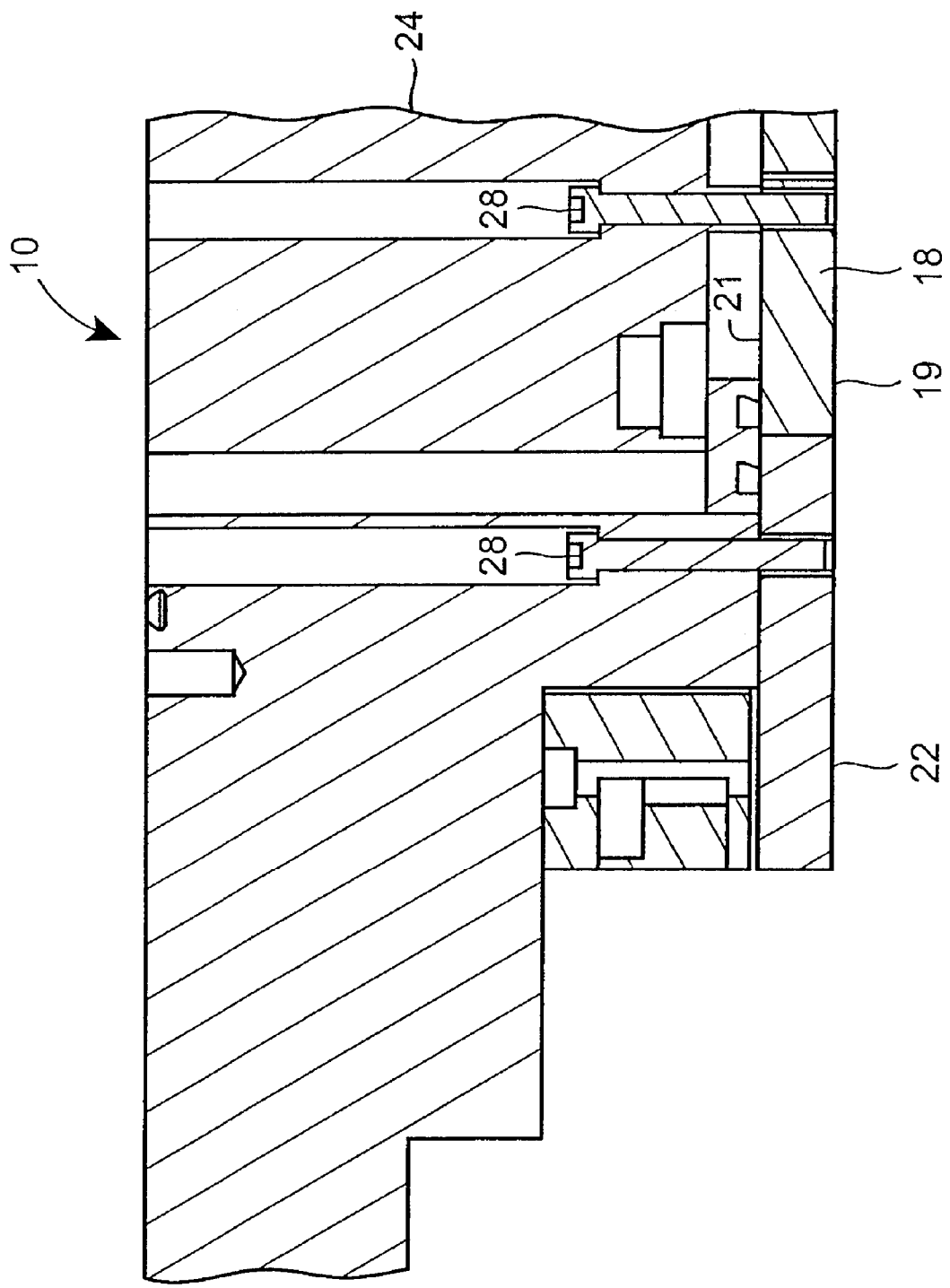
FIG. 6 is a cross-sectional view in the direction of line 6-6 in FIG. 5.
Figure 7:
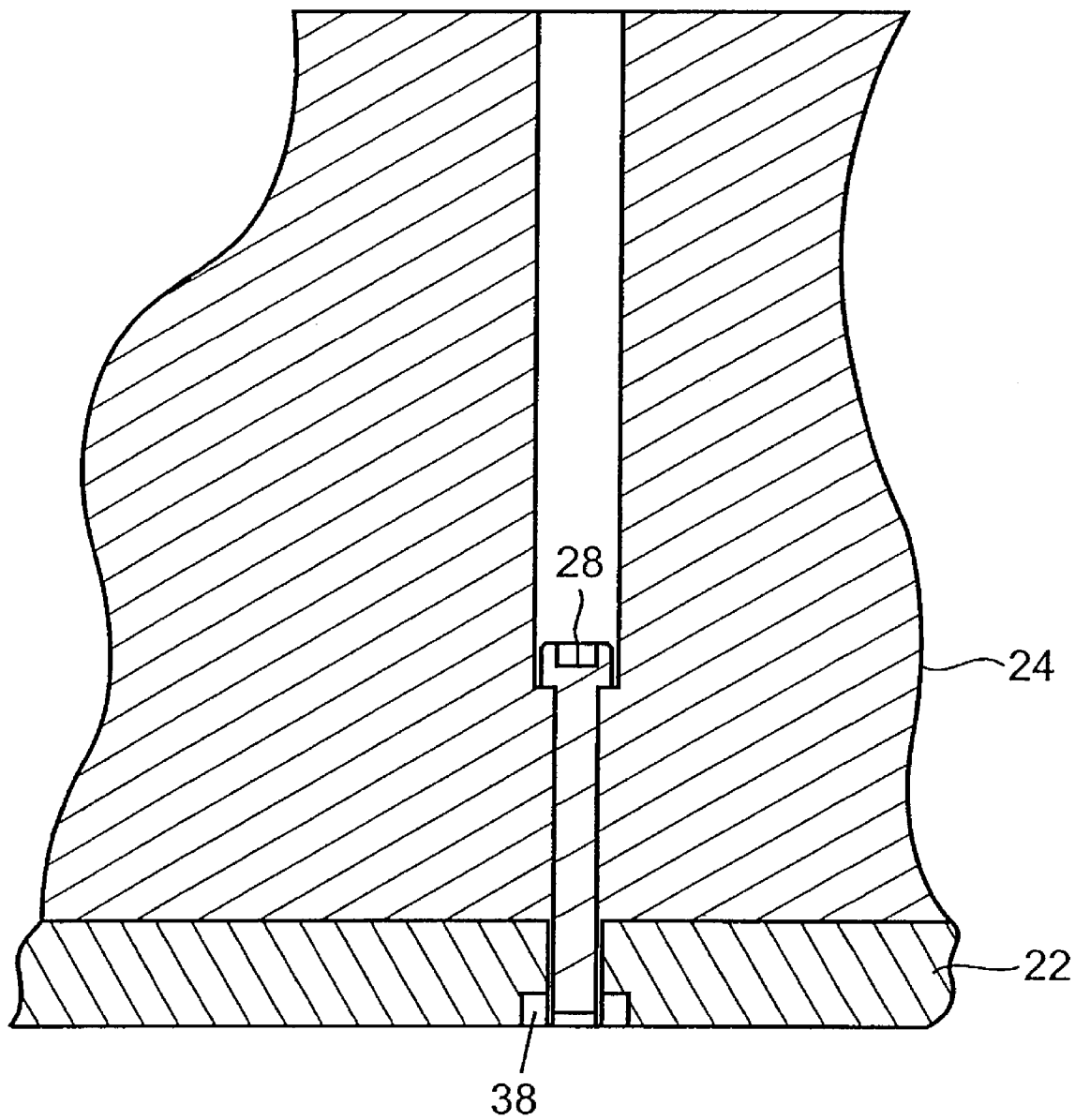
FIG. 7 is a cross-sectional view in the direction of line 7-7 in FIG. 5.

A stronger connection between the electrode assembly 10 and the top plate 24 is provided by first and second fastener members, where a portion of one of the fastener members faces a bearing surface of the backing member. FIGS. 3 and 4 show a preferred T-nut configuration of a first fastener member 38. FIGS. 5-7 show further views of the fastener member 38. The fastener member 38 preferably includes a head 40, shaft 42, and internal threads 44. The threads 44 engage with the threads of a second fastener member 28 when the backing member is attached to the top plate 24.

Figure 9:
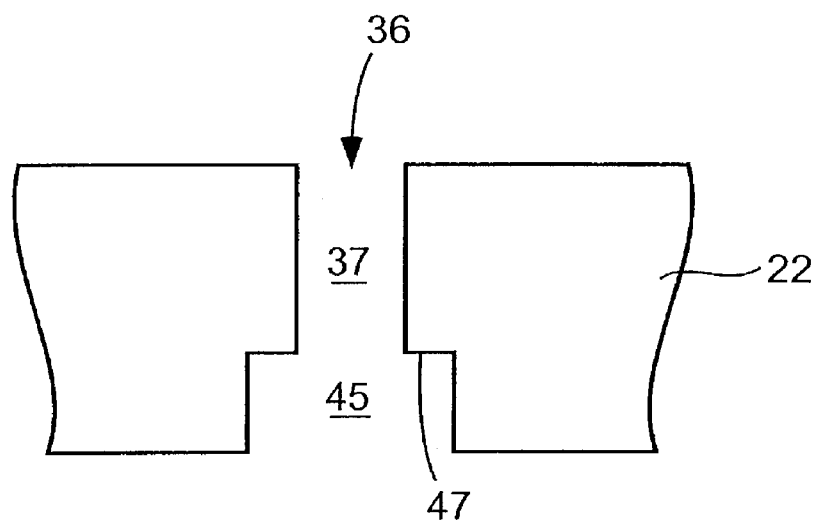
FIG. 9 depicts an aperture in a backing ring.

As shown in FIG. 9, the apertures 36 in the backing plate 18 and in the backing ring 22 preferably have a stepped configuration, and include a first portion 37 and a wider second portion 45. The second portion 45 is partially defined by a bearing surface 47. The head 40 of the fastener member 38 is sized to fit into the second portion 45 of the aperture 36 formed in the backing plate 18, and the second portion 45 of the aperture 36 formed in the backing ring 22. In embodiments in which the gas injection holes of the upper electrode are vertical, the fastener member 38 preferably is aligned in the direction of the gas injection holes.

Other aperture configurations than a stepped aperture shown in FIG. 9 can alternatively be used. Such other configurations include multiple-stepped apertures, tapered apertures, and the like. The cross-section of the apertures 36 can be semi-circular, circular, polyhedral, or have other non-circular configurations. Preferably, the apertures 36 are shaped to match the shape of the fastener members 38 to prevent rotation of the fastener members 38 when they are inserted in the apertures 36.

In the embodiment shown in FIG. 4, the head 40 of the fastener member 38 has at least one transverse dimension, d, which exceeds the maximum transverse dimension (e.g., the diameter) of the first portion 37 of the aperture 36. The configuration of the head 40 prevents the fastener member 38 from being pulled out of the aperture 36 toward the top plate 24. Consequently, the fastener member 38 provides a significantly greater pull-out force than the helicoil 34. Also, because the head 40 prevents the fastener member 38 from turning in the aperture 36, the fastener member 38 does not back out of the aperture 36 when the fastener member 28 is disengaged from the fastener member 38.

To prevent rotation of the fastener member 38, the head 40 preferably has a non-circular shape. The second portion 45 of the aperture 36 preferably is shaped to mate with the head 40 when T-nuts are used as the fastener member 38. The configuration of the head 40 provides a bearing surface 48 facing the bearing surface 47 of the second portion 45. This arrangement increases the failure bolt force, and prevents rotation of the fastener member 38 relative to the backing plate 18 and the backing ring 22 when the head 40 is received in the second portion 45 of the aperture 36.

The fastener member 38 is not limited to a T-nut configuration. The head 40 of the fastener member 38 can alternatively have other non-circular shapes, such as semi-circular, D-shaped, oval, polygonal shapes, including triangular, rectangular, square, trapezoidal, hexagonal, and the like. For such other shapes, the second portion 45 of the apertures 36 in the backing plate 18 and in backing ring 22 preferably have a matching shape to prevent rotation of the fastener member 38 relative to the backing plate 18 and to the backing ring 22.

Alternatively, the head 40 can have a circular shape, but also include a key in the axial direction, which is received in a mating portion of the aperture 36.

In another embodiment, the head 40 of the fastener member 38 can be circular and non-concentric with respect to the shaft 42. Such configuration prevents rotation of the fastener member 38 in the mating aperture.

The upper electrode assembly can include fastener members 38 having the same, or a different, head configuration from each other.

The aperture 36 can be formed in the backing plate 18 and in the backing ring 22 by any suitable technique, such as milling, drilling, casting, molding, and the like. If desired, the backing plate 18 can include two or more layers bonded together, with each layer including an aperture corresponding to a portion of the aperture 36.

In a preferred embodiment, the fastener member 38 is bonded to the bearing surface 47 using an adhesive, such as an elastomer, or the like. The adhesive prevents the fastener member 38 from coming out of the recess 44 during assembly, and also provides a cushion to spread the bearing and torsional loads. After the backing plate 18 and backing ring 22 have been bonded to the inner electrode member 12 and outer electrode member 14, respectively, the fastener member 38 is trapped between the upper electrode and backing member.

The fastener member 38 can be made of any suitable material. The fastener member 38 can be made of metals and metal alloys including, for example, stainless steels, such as Nitronic-60, or molybdenum. Nitronic-60 provides resistance to galling in a vacuum environment. Molybdenum has a coefficient of thermal expansion that closely matches the coefficient of thermal expansion of graphite, which is preferably used for the backing plate 18 and backing ring 22. Alternatively, the fastener member 38 can be made of a non-metallic material, such as a ceramic, polymer, or composite.

Figure 8:
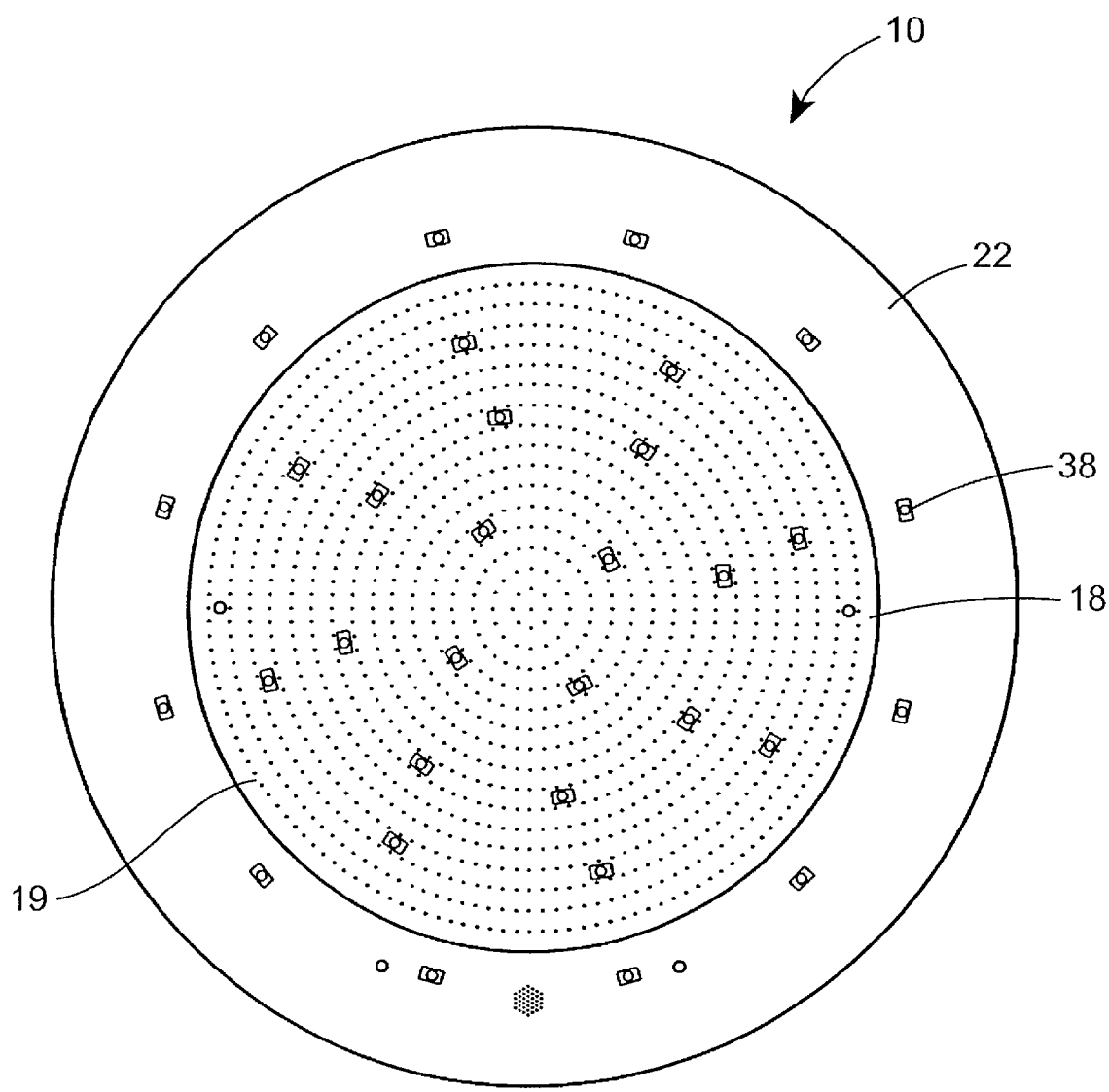
FIG. 8 is a bottom plan view of a preferred embodiment of an upper electrode assembly with the electrode removed to show an exemplary pattern of fastener members.

FIG. 8 is a bottom view of the upper electrode assembly 10 with the inner electrode member 12 and the outer electrode member 14 removed to show an exemplary concentric arrangement of fastener members 38 installed in the backing plate 18 and backing ring 22. The upper electrode assembly 10 preferably includes from about 8 to 32 fastener members 38. Concentrically arranged gas injection holes 48 formed in the backing plate 18 are also shown in FIG. 8. The gas injection holes 48 are preferably aligned with gas passages in the inner electrode member 12.

Figure 10:
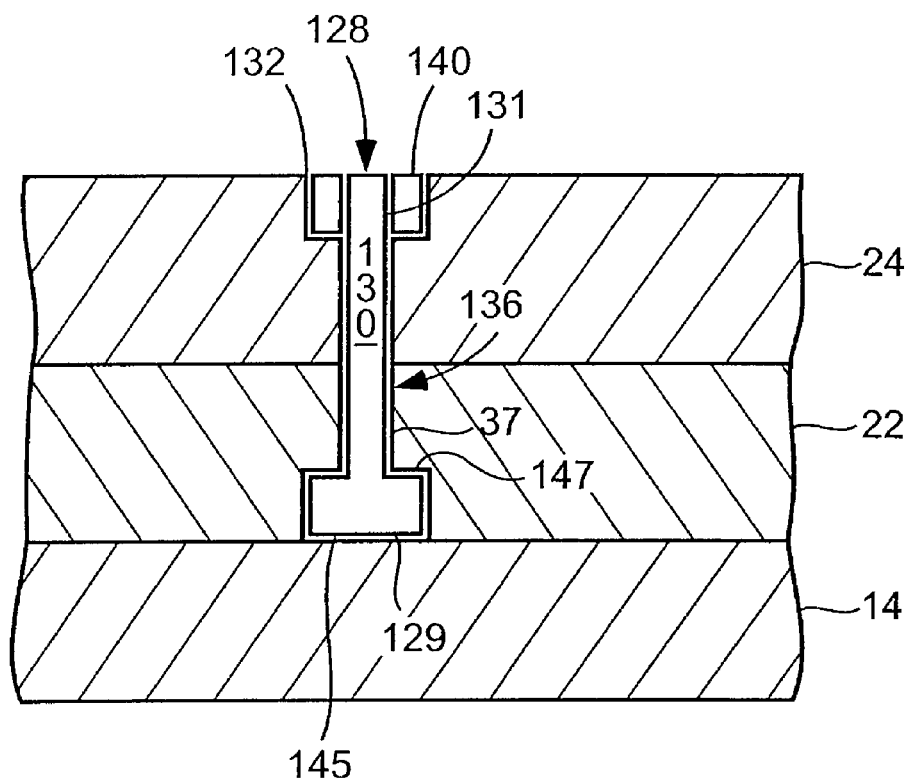
FIG. 10 depicts another preferred embodiment of an upper electrode assembly.

FIG. 10 depicts another preferred embodiment of an upper electrode assembly including an alternative fastening arrangement. A fastener member 128 is received in an aperture 136 in the backing ring 22, and in an opening 132 in the top plate 24 (the backing plate 18, inner electrode member 12, and associated portion of the top plate 24 are not shown for simplicity). The fastener member 128 includes a head 129 and a shaft 130. The shaft 130 preferably includes external threads 131 at an upper portion 131. A fastener member 140, such as a threaded nut, engages the threads 131 to secure the top plate 24 to the backing ring 22 and to the outer electrode member 14.

In the embodiment shown in FIG. 10, the fastener member 128 preferably is bonded to a bearing surface 147 of the backing ring 22 with a suitable adhesive, as described above.

While the invention has been described in detail with reference to specific embodiments thereof, it will be apparent to those skilled in the art that various changes and modifications can be made, and equivalents employed, without departing from the scope of the appended claims.

What is claimed is:

1. A method of making an electrode assembly for a plasma processing apparatus, comprising:

mounting a plurality of first fastener members in a plurality of apertures of a backing member, each aperture including a first portion and a second portion wider than the first portion, each first fastener member including a head disposed in the second portion of an aperture;

bonding the head of each of the first fastener members to a bearing surface that partially defines the second portion of the aperture; and securing the backing member to an electrode;

the head of each of the first fastener members being configured to prevent the first fastener members from being pulled out of the respective apertures in a direction away from the electrode or from rotating.

2. The method of claim 1, further comprising fastening the backing member to a top plate including a plurality of through openings each of which is aligned with a respective aperture of the backing member, the fastening including inserting a second fastener member in openings of the top plate such that each second fastener member engages a respective first fastener member to secure the backing member to the top plate.

3. The method of claim 1, wherein the first fastener members are T-nuts.

4. The method of claim 3, wherein each of the T-nuts has internal threads, and the second fastener member comprises a bolt threaded into a respective one of the T-nuts.

5. The method of claim 2, wherein the head is a rectangular shaped head and the second portion of the apertures is rectangular in shape.

6. The method of claim 2, wherein the electrode comprises an inner silicon electrode and an outer silicon electrode comprised of overlapping contiguous segments, the backing member comprising a plate adhesively bonded to the inner silicon electrode and a ring adhesively bonded to the outer silicon electrode.

7. The method of claim 2, wherein the electrode comprises a showerhead electrode having gas passages and the backing member comprises a backing plate having gas injection holes, the method further comprising bonding the showerhead electrode to the backing plate with the gas injection holes of the backing plate aligned with the gas passages of the showerhead electrode.

8. The method of claim 2, wherein the electrode comprises a showerhead electrode and the first fastener members comprise a plurality of fastener members concentrically arranged at locations between adjacent rows of gas passages in the showerhead electrode.

* * * * *